(12) United States Patent
Ariga et al.

(10) Patent No.: US 8,731,019 B2
(45) Date of Patent: May 20, 2014

(54) LASER MODULE

(75) Inventors: Maiko Ariga, Tokyo (JP); Toshio Kimura, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 120 days.

(21) Appl. No.: 13/388,667

(22) PCT Filed: May 9, 2011

(86) PCT No.: PCT/JP2011/061122
§ 371 (c)(1),
(2), (4) Date: Feb. 3, 2012

(87) PCT Pub. No.: WO2011/142469
PCT Pub. Date: Nov. 17, 2011

(65) Prior Publication Data
US 2012/0140476 A1 Jun. 7, 2012

(30) Foreign Application Priority Data
May 11, 2010 (JP) .................................. 2010-109207

(51) Int. Cl.
*H01S 3/08* (2006.01)
(52) U.S. Cl.
USPC .......................................... 372/107; 372/101
(58) Field of Classification Search
USPC ........................................ 372/52.12, 101, 107
See application file for complete search history.

(56) References Cited

U.S. PATENT DOCUMENTS

2005/0058167 A1* 3/2005 Kuramachi et al. ............. 372/43
2010/0158522 A1* 6/2010 Cho et al. ........................ 398/65

FOREIGN PATENT DOCUMENTS

| CN | 1403525 | 3/2003 |
|---|---|---|
| CN | 1604413 | 4/2005 |
| JP | 09-096730 | 4/1997 |
| JP | 2002-232056 | 8/2002 |
| JP | 2003-147321 | 5/2003 |
| JP | 2004-126319 | 4/2004 |
| JP | 2005-17359 | 1/2005 |
| JP | 2005-109413 | 4/2005 |
| JP | 2006-301597 | 11/2006 |
| JP | 2007-157938 | 6/2007 |
| JP | 2007-250889 | 9/2007 |

OTHER PUBLICATIONS

"Office Action of Japan Counterpart Application", with English translation thereof, mailed on Jul. 23, 2013, P1-P6, in which JP2005-109413, JP2005-17359, JP2003-147321, and JP2007-157938 were cited.
"1st Office Action of China Counterpart Application", with English translation thereof, issued on Sep. 29, 2013, P1-P14, in which references were cited.

* cited by examiner

*Primary Examiner* — Armando Rodriguez
(74) *Attorney, Agent, or Firm* — Jianq Chyun IP Office

(57) ABSTRACT

[Objective]
To restrict degradation of optical characteristics due to a resin adhesive containing an inorganic filler.
[Means]
The width d of a lens body 31 and the height of an inorganic filler 341 in a direction orthogonal to the surface of a substrate are set such that an inclination angle of a collimating lens 3 does not exceed a maximum tolerable inclination angle when the inorganic filler 341 is positioned near the width-wise center of the lens body 31. As a result, even when the inorganic filler 341 is inserted between the bottom surface of the collimating lens 3 and the top surface of the substrate 4, degradation of the optical characteristics of the laser module including skewing of the optical axis of the laser light and distortion of the beam shape of the laser light can be restricted.

13 Claims, 6 Drawing Sheets

| LENS WIDTH d (mm) | TOLERABLE FILLER HEIGHT h ($\mu$m) |
|---|---|
| 0.1 | 1.74 |
| 0.2 | 3.49 |
| 0.3 | 5.23 |
| 0.4 | 6.98 |
| 0.5 | 8.72 |
| 0.6 | 10.47 |
| 0.7 | 12.21 |
| 0.8 | 13.96 |
| 0.9 | 15.70 |
| 1.0 | 17.45 |
| 1.1 | 19.19 |
| 1.2 | 20.94 |
| 1.3 | 22.68 |
| 1.4 | 24.43 |
| 1.5 | 26.17 |
| 1.6 | 27.92 |
| 1.7 | 29.66 |
| 1.8 | 31.41 |
| 1.9 | 33.15 |
| 2.0 | 34.90 |

TOLERABLE INCLINATION ANGLE $\theta_{max}=2°$

FIG. 7

LASER MODULE

CROSS-REFERENCE TO RELATED APPLICATION

This application is a 371 of international application of PCT application serial no. PCT/JP2011/061122, filed on May 9, 2011, which claims the priority benefit of Japan application no. 2010-109207, filed on May 11, 2010. The entirety of each of the above-mentioned patent applications is hereby incorporated by reference herein and made a part of this specification.

TECHNICAL FIELD

The present invention relates to a laser module including a lens that collimates or focuses a laser light emitted from a laser light source.

BACKGROUND ART

A conventional laser module provided with a lens that collimates or focuses a laser light emitted from a laser light source is known. In such a conventional laser module, the lens is held in a metal frame with an incident plane and an output plane exposed, and a soldering is used to fix the metal frame to a substrate. However, the metal frame makes it difficult to lower the cost and downsize the laser module. Therefore, recent lenses do not use a metal frame, and are instead attached to the substrate using a resin adhesive (see, for example, Patent Documents 1 and 2).

Patent Document 1: Japanese Patent Application Laid-open No. 2006-301597
Patent Document 2: Japanese Patent Application Laid-open No. 2004-126319

DISCLOSURE OF THE INVENTION

Some resin adhesives include filler (dispersed particles) whose main component is inorganic material, to adjust characteristics of the resin adhesive used to attach the lens to the substrate, such as linear expansion coefficient, cure shrinkage, and thermal conductivity. When using a resin adhesive containing such a filler, however, the insertion of the filler between the bonding surface of the lens and the top surface of the substrate causes the lens to be bonded as it is inclined with respect to a direction normal to the surface of the substrate. If the inclined angle of the bonded lens with respect to the direction normal to the surface of the substrate exceeds a tolerable angle (hereinafter, "tolerable inclination angle"), the optical axis of the laser light becomes misaligned and the beam profile of the laser light becomes distorted, causing degradation of the optical characteristics of the laser module. Therefore, it is desired to provide a laser module that can suppress degradation of the optical characteristics due to the resin adhesive containing inorganic filler.

The present invention has been achieved in view of the above problems, and it is an object of the present invention to provide a laser module that can suppress degradation of optical characteristics due to a resin adhesive containing inorganic filler.

To solve the above problems and to achieve the object, according to one aspect of the present invention, there is provided a laser module including a laser light source that emits a laser light and a lens that is bonded to a surface of a substrate by a resin adhesive. The lens collimates or focuses the laser light emitted from the laser light source. The resin adhesive includes a filler whose main component is an inorganic material. A height h of the filler in a direction normal to the surface of the substrate satisfies $$h \leq \frac{d}{2}\sin\theta_{max} \quad (1)$$

where d is width of a bonding surface of the lens in a direction of an optical axis of the laser light and $\theta_{max}$ is tolerable inclination angle of the lens.

In the laser module described above the height h of the filler may be less than or equal to 8 micrometers when the bonding surface width d of the lens is no less than 0.5 millimeters and no greater than 1 millimeter.

The filler may include an inorganic material selected from a group of $SiO_2$, $Mg_3Si_4O_{10}(OH)_2$, $Al_2O_3$, MN, BN, and $TiO_2$ as a main component thereof.

The filler has a spherical, scale-like, plate-like, or pulverized-lump shape.

Content of the filler in the resin adhesive may be greater than or equal to 25 wt % (weight percentage).

The resin adhesive may includes a resin material selected from a group of epoxy resin, acrylic resin, urethane resin, and silicon resin as a main component thereof.

The laser light source may be a distributed feedback semiconductor laser element.

The laser light source may be a distributed reflector semiconductor laser element.

The laser light source may be an array-type semiconductor laser element formed by integrating a plurality of longitudinal single-mode semiconductor laser elements, a semiconductor optical amplifier that amplifies laser lights emitted from the longitudinal single-mode semiconductor laser elements, and a multiplexer that guides the laser lights emitted from the longitudinal single-mode semiconductor laser elements to the semiconductor optical amplifier.

The lens may collimate the laser light and output a collimated laser light. The laser module may further include a focusing lens that receives the collimated laser light. The tolerable inclination angle $\theta_{max}$ may be determined based on one or more of a distance between the lens and the focusing lens, a diameter of an acceptance area in which to the laser light is accepted by the focusing lens, and spot size of the laser light.

When the spot size of the laser light is 0.5 millimeters and the diameter of the tolerable input region is 1.55 millimeters, the distance between the lens and the focusing lens may be 15 millimeters.

Effect of the Invention

The laser module according to the present invention can restrict degradation of optical characteristics due to a resin adhesive containing an inorganic filler.

BRIEF DESCRIPTION OF DRAWINGS

FIG. 7 shows a relationship between lens width and the tolerable height of the filler when tolerable inclination angle of the collimating lens is 2 degrees.

DETAILED DESCRIPTION

Exemplary embodiments of the present invention are explained in detail below with reference to accompanying drawings.

Figure 1:
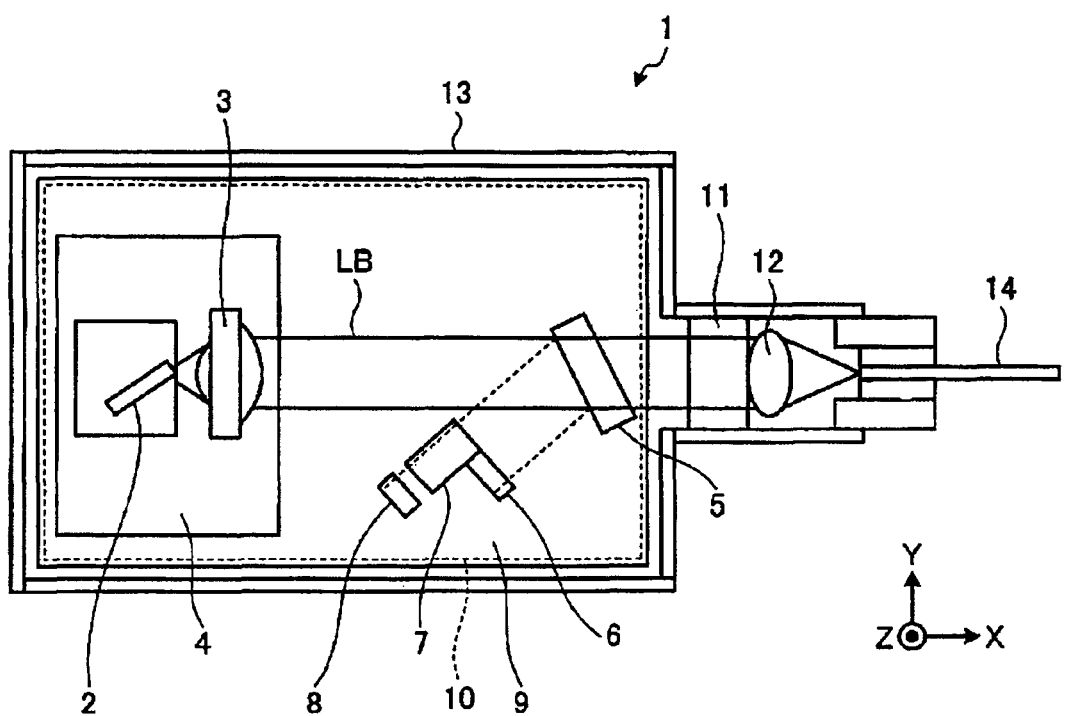
FIG. 1 is a schematic cross-sectional view of a laser module according to a first embodiment of the present invention as seen from above.
Figure 2:
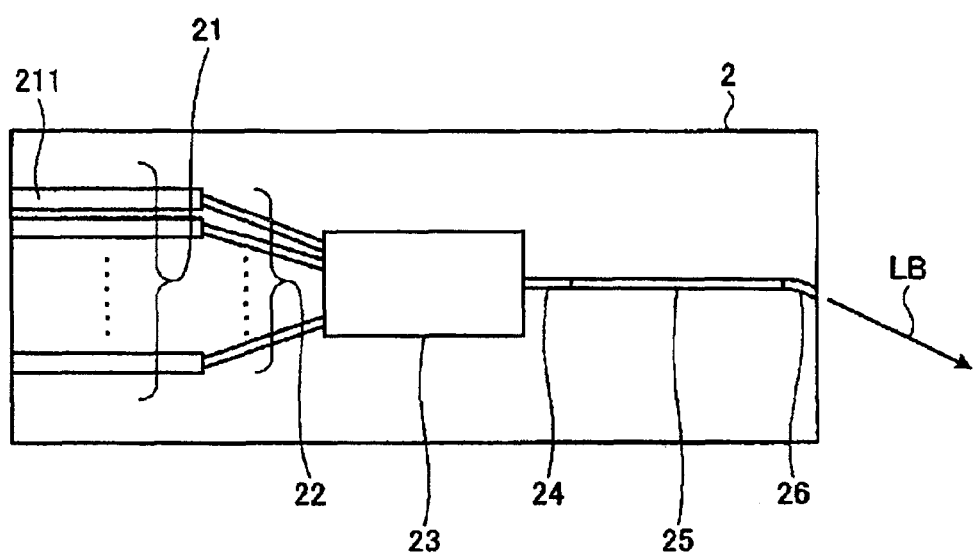
FIG. 2 is a schematic view of the structure of a laser light source shown in FIG. 1.

FIGS. 1 and 2 are used to describe the structure of a laser module 1 according to a first embodiment of the present invention.

FIG. 1 is a schematic cross-sectional view of the laser module 1 as seen from above. FIG. 2 is a schematic view of the structure of a laser light source 2 shown in FIG. 1. In this Specification, the direction in which the laser light is emitted, i.e. the direction of the optical axis, in a horizontal plane defines the X-axis, the direction perpendicular to the X-axis in the horizontal plane defines the Y-axis, and the direction normal to the horizontal XY-plane, i.e. the vertical direction, defines the Z-axis.

As shown in FIG. 1, the laser module 1 includes the laser light source 2, a collimating lens 3, a substrate 4, a beam splitter 5, a power-monitoring photodiode 6, an etalon filter 7, a wavelength-monitoring photodiode 8, a base plate 9, a Peltier device 10, an optical isolator 11, a focusing lens 12, and a case 13 that houses these components.

As shown in FIG. 2, the laser light source 2 includes a semiconductor laser array 21, waveguides 22, a multiplexer 23, a waveguide 24, a semiconductor optical amplifier (SOA) 25, and a curved waveguide 26. The laser light source 2 is an array-type semiconductor laser element formed by integrating the above components on a single substrate.

The semiconductor laser array 21 includes a plurality of longitudinal single-mode semiconductor laser elements (hereinafter, "semiconductor laser elements") 211 formed in a stripe to emit a laser light with different wavelengths from a front facet. The semiconductor laser elements 211 are distributed feedback (DFB) laser elements, and the oscillation wavelengths thereof can be controlled by adjusting the temperature of the elements.

More specifically, the oscillation wavelength of each semiconductor laser element 211 can be changed in a range from approximately 3 nanometers to 4 nanometers, for example. The semiconductor laser elements 211 are designed such that the oscillation wavelengths thereof have intervals of approximately 3 nanometers to 4 nanometers therebetween. Therefore, by switching the semiconductor laser elements 211 and controlling the temperature of the semiconductor laser elements 211, the semiconductor laser array 21 can emit a laser light LB with a wavelength region that is continuous over a wider bandwidth than a single semiconductor laser element.

By integrating ten or more semiconductor laser elements 211 with oscillation wavelengths that can be changed in a range from 3 nanometers to 4 nanometers, the wavelength of the laser light can be changed over a wavelength region of 30 nanometers or more. Accordingly, these ten or more semiconductor laser elements 211 can cover the entire wavelength region used for WDM communication, which can be a C-band from 1.53 micrometers to 1.56 micrometers or an L-band from 1.57 micrometers to 1.61 micrometers, for example.

A waveguide 22 is provided for each semiconductor laser element 211, and guides the laser light LB emitted from the corresponding semiconductor laser element 211 to the multiplexer 23. The multiplexer 23 may be a multimode interferometer (MMI) coupler, for example, and guides the laser lights LB from the waveguides 22 to the waveguide 24. The waveguide 24 guides the laser light LB from the multiplexer 23 to the semiconductor optical amplifier 25. The semiconductor optical amplifier 25 amplifies the laser light LB guided by the waveguide 24, and guides the amplified laser light LB to the curved waveguide 26.

The curved waveguide 26 emits the laser light LB guided by the semiconductor optical amplifier 25 in the X-axis direction at an angle of approximately 7 degrees with respect to the emitting facet. The angle that the laser light LB forms with respect to the emitting facet is preferably adjusted to be in a range from 6 degrees to 12 degrees. As a result, less light is reflected toward the semiconductor laser array 21.

The following describes the structure of the laser module 1 based on FIG. 1. The collimating lens 3 is arranged near the emitting facet of the laser light source 2. The collimating lens 3 collimates the laser light LB emitted from the laser light source 2, and guides the collimated laser light LB to the beam splitter 5. The substrate 4 has the laser light source 2 and the collimating lens 3 loaded on a horizontal installation surface thereof, which is in the XY-plane.

The beam splitter 5 transmits a portion of the laser light LB from the collimating lens 3, and guides this portion to the optical isolator 11. The beam splitter 5 splits the other portion of the laser light LB from the collimating lens 3, i.e. the portion not transmitted by the beam splitter 5, toward the power-monitoring photodiode 6 and the etalon filter 7. The power-monitoring photodiode 6 detects the power of the laser light LB split by the beam splitter 5. The power-monitoring photodiode 6 inputs, to a control apparatus connected to the laser module 1, an electric signal corresponding to the detected power.

The etalon filter 7 has periodic transmission characteristics with respect to the wavelength of the laser light LB, and selectively transmits the laser light LB with a power corresponding to the transmission characteristics, to be input to the wavelength-monitoring photodiode 8. The wavelength-monitoring photodiode 8 detects the power of the laser light LB input from the etalon filter 7, and inputs an electric signal corresponding to the detected power to the control apparatus. The power of the laser light LB detected by the power-monitoring photodiode 6 and the wavelength-monitoring photodiode 8 is used by the control apparatus to perform wavelength locking control.

Specifically, the laser module 1 is controlled by the control apparatus to perform the wavelength locking control by controlling drive current of the semiconductor optical amplifier 25 such that a ratio between the power of the laser light LB detected by the power-monitoring photodiode 6 and the power of the laser light detected by the wavelength-monitoring photodiode 8 matches the ratio achieved when the oscillation wavelength and power of the laser light LB are desired values. Furthermore, the laser module 1 adjusts the temperature of the laser light source 2 by controlling a Peltier device (not shown) provided between the laser light source 2 and the substrate 4. With the structure described above, the laser module 1 can control the oscillation wavelength and power of the laser light LB to be the desired values.

The base plate 9 has a horizontal installation surface in the XY-plane, on which the substrate 4, the beam splitter 5, the power-monitoring photodiode 6, the etalon filter 7, and the wavelength-monitoring photodiode 8 are loaded. The Peltier device 10 has a horizontal installation surface in the XY-plane, on which the base plate 9 is loaded. The Peltier device 10 cools the laser light source 2 via the base plate 9 and the substrate 4, and controls the selected wavelength of the etalon filter 7 by adjusting the temperature of the etalon filter 7 via the base plate 9. The optical isolator 11 restricts back-reflected light from the optical fiber 14 from recombining with the laser light LB. The focusing lens 12 combines the laser light LB transmitted by the beam splitter 5 in the optical fiber 14 to be output.

Figure 3:
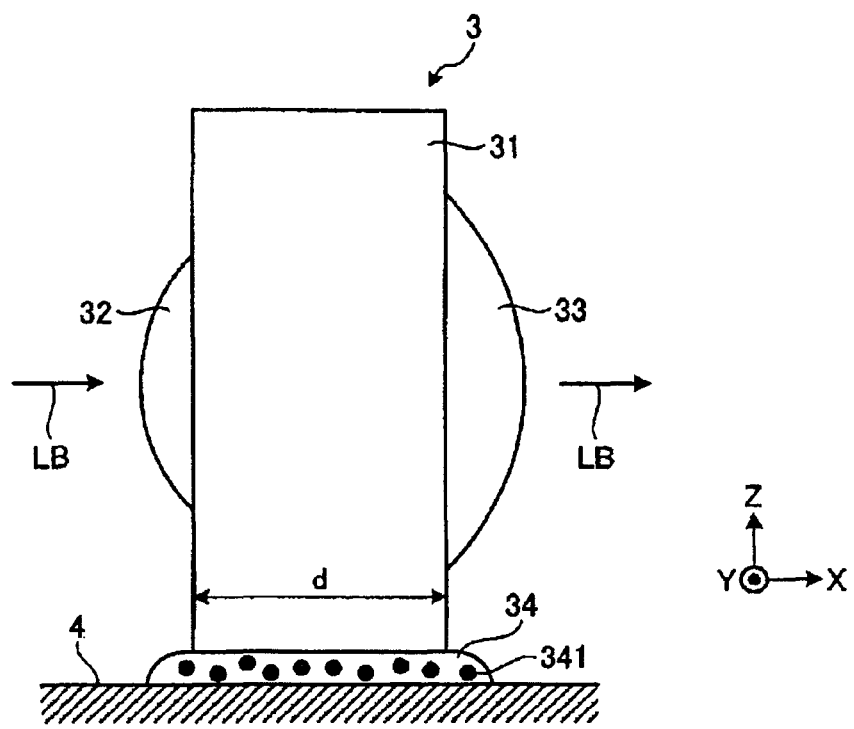
FIG. 3 shows an exemplary configuration of a collimating lens shown in FIG. 1.

The following references FIG. 3 to describe the structure of the collimating lens 3. FIG. 3 shows an exemplary configuration of the collimating lens 3. As shown in FIG. 3, the collimating lens 3 is a two-sided lens that includes a lens body 31 having a rectangular parallelepiped shape with a width d in the direction of the optical axis of the laser light LB, a lens section 32 formed on the side of the lens body 31 incident to the laser light LB, and a lens section 33 formed on the side of the lens body 31 from which the laser light LB is emitted. The collimating lens 3 is made of a material such as glass, crystal, diamond, or ruby.

The collimating lens 3 is fixed to the surface of the substrate 4 using a resin adhesive 34 that contains an inorganic filler 341 whose main component is inorganic material. The resin adhesive 34 bonds the bottom surface of the lens body 31 to the top surface of the substrate 4. The inorganic filler 341 preferably includes an inorganic material selected from among $SiO_2$, $Mg_3Si_4O_{10}(OH)_2$, $Al_2O_3$, AlN, BN, and $TiO_2$ as the main component thereof. The shape of the inorganic filler 341 is preferably spherical, scale-like, board-like, or pulverized-lump.

The inorganic filler 341 content in the resin adhesive 34 is preferably no less than 25 wt % and no greater than 95 wt %. In order to adjust characteristics of the resin adhesive 34 such as the cure shrinkage rate, the linear thermal expansion coefficient, and the thermal conductivity coefficient, the inorganic filler 341 content must be 25 wt % or more. On the other hand, if the inorganic filler 341 content is greater than 95 wt %, the viscosity of the resin adhesive 34 becomes too high, which lowers the workability, and the resin adhesive 34 becomes brittle, which decreases the adhesiveness. The resin adhesive 34 preferably includes resin material selected from among epoxy resin, acrylic resin, urethane resin, and silicon resin as the main component thereof.

In the laser module 1 having the structure described above, setting the tolerable height of the inorganic filler 341 in a direction normal to the surface of the substrate 4, which is the Z-axis direction and a direction perpendicular to the optical axis of the laser light LB, in the manner shown below prevents the collimating lens 3 from exceeding an tolerable angle range, which defines angles for which skew of the optical axis and distortion of the beam shape of the laser light LB are within an tolerable range, with respect to a direction normal to the surface of the substrate 4. The following references FIGS. 4 to 6 to describe the tolerable height of the inorganic filler 341.

Figure 4:
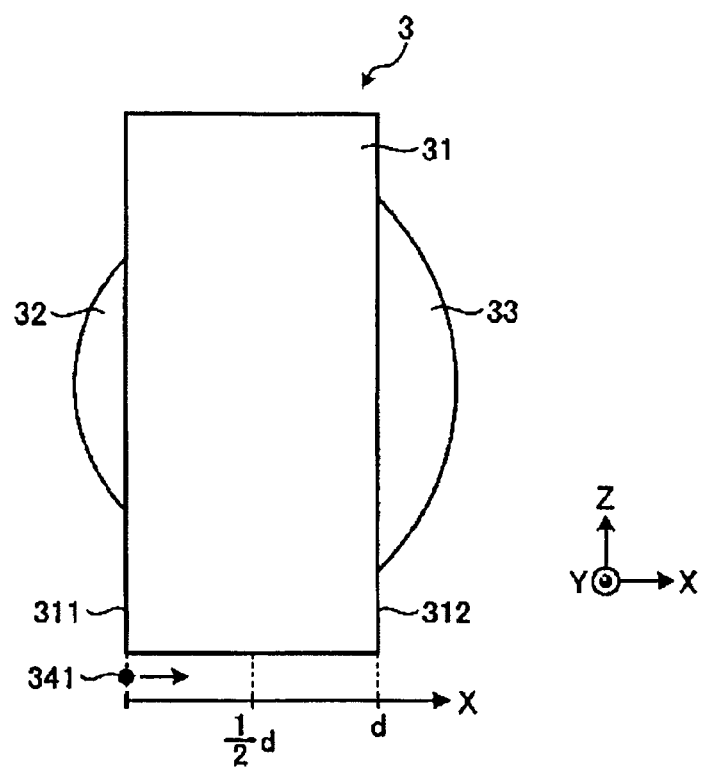
FIG. 4 is a schematic view used to describe a method for deriving tolerable height of inorganic filler in a direction normal to a substrate surface.
Figure 5:
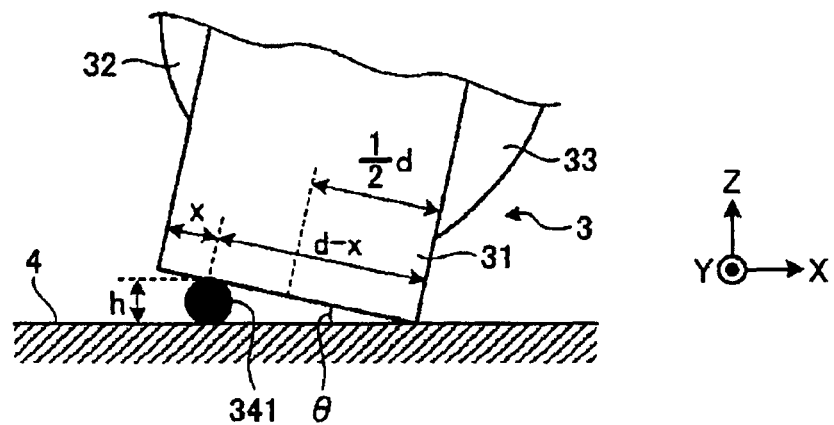
FIG. 5 is a schematic view of the collimating lens inclined toward its output surface.
Figure 6:
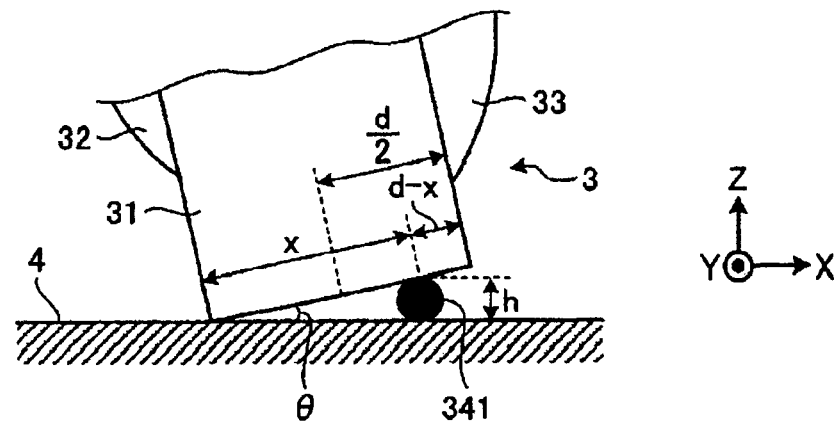
FIG. 6 is a schematic view of the collimating lens inclined toward its incident surface.

FIGS. 4 to 6 are schematic views used to describe a method for deriving the tolerable height of the inorganic filler 341 in the direction normal to the surface of the substrate 4. As shown in FIG. 4, a situation can be thought of in which one inorganic filler 341 is provided between the bonding surface, i.e. bottom surface, of the lens body 31 and the substrate, not shown. In the following description, the incident surface side 311 of the lens body 31 is positioned at X=0, the output surface side 312 of the lens body 31 is positioned at X=d, and the inorganic filler 341 is positioned at X=x in the X-axis direction, which is the direction of the width of the lens body 31.

In this state, moving the inorganic filler 341 closer to the width-wise center (X=½d) from the incident surface side 311 of the lens body 31 causes the collimating lens 3 to be inclined toward the output surface, as shown in FIG. 5, and the inclination angle θ increases. When the inorganic filler 341 is moved beyond the width-wise center of the lens body 31, the collimating lens 3 is inclined toward the incident surface, as shown in FIG. 6, and the inclination angle θ decreases. Therefore, the inclination angle θ of the collimating lens 3 is at the maximum when the inorganic filler 341 is positioned at the width-wise center.

Accordingly, by setting the tolerable height h of the inorganic filler 341 in the direction normal to the substrate 4 and the bonding surface width d of the lens body 31 such that the inclination angle θ of the collimating lens 3 when the inorganic filler 341 is positioned near the width-wise center does not exceed a maximum tolerable inclination angle $\theta_{max}$, degradation of the optical characteristics of the laser module 1 can be restricted even when the inorganic filler 341 is inserted between the bottom surface of the collimating lens 3 and the top surface of the substrate 4.

Specifically, as made clear from FIGS. 5 and 6, the sine value sin θ of the inclination angle θ of the collimating lens 3 can be expressed as shown below in Expression (2). Therefore, the sine value $\sin \theta_{max}$ of the maximum tolerable inclination angle $\theta_{max}$ for the inclination angle θ of the collimating lens 3 can be expressed as shown below in Expression (3). Accordingly, by setting the tolerable height h of the inorganic filler 341 in the direction normal to the surface of the substrate 4 in a manner to satisfy Expression (4) shown below, degradation of the optical characteristics of the laser module 1 can be restricted even when the inorganic filler 341 is inserted between the bottom surface of the collimating lens 3 and the top surface of the substrate 4.

$$\sin\theta = \frac{h}{d-x} \qquad (2)$$

$$\sin\theta_{max} = \frac{h}{\frac{d}{2}} = \frac{2h}{d} \qquad (3)$$

$$h \le \frac{d}{2}\sin\theta_{max} \qquad (4)$$

Based on the results of rigorous study, the inventors of the present invention discovered that inclining the collimating lens 3 by more than 2 degrees with respect to the direction normal to the surface of the substrate 4 causes a large amount of beam distortion and optical axis skew of the laser light LB, which results in degradation of the optical characteristics of the laser module 1. When the maximum tolerable inclination angle $\theta_{max}$ is 2 degrees, Expression (4) can be used to calculate the relationship between the bonding surface width d of the collimating lens 3 and the tolerable height h of the inorganic filler 341 shown in FIG. 7. Accordingly, when the maximum tolerable inclination angle $\theta_{max}$ is 2 degrees, degradation of the optical characteristics of the laser module 1 can be restricted by setting the bonding surface width d of the collimating lens 3 and the tolerable height h of the inorganic filler 341 based on the relationship shown in FIG. 7.

More specifically, when the bonding surface width d of the collimating lens 3 is set to be no less than 0.5 millimeters and no greater than 1.0 millimeters in order to miniaturize the laser module 1, the inclination angle of the collimating lens 3 can be prevented from exceeding the maximum tolerable inclination angle of 2 degrees by setting the height h of the inorganic filler 341 to be 8 μm or less, thereby restricting degradation of the optical characteristics of the laser module 1.

The maximum tolerable inclination angle $\theta_{max}$ is determined based on one or more of the distance between the collimating lens 3 and the focusing lens 12, the diameter of an acceptance area in which the laser light is accepted by the focusing lens 12, and a spot size of the laser light output from the laser light source 2, for example. More specifically, when the distance D between the collimating lens 3 and the focusing lens 12 is 15.0 millimeters, the diameter $\theta_1$ of the acceptance area in which the laser light is accepted by the focusing lens 12 is 1.55 millimeters, and the spot size $\theta_2$ of the laser light output from the laser light source 2 is 0.5 millimeters, the maximum tolerable inclination angle $\theta_{max}$ can be calculated as shown below.

In order to restrict degradation of the optical characteristics of the laser module 1, the laser light must be accepted in the acceptance area of the focusing lens 12. Accordingly, the inclination of the collimating lens 3 that results in the outer circumference of the laser light contacting the outer circumference of the acceptance area of the focusing lens 12 is set as the maximum tolerable inclination angle $\theta_{max}$.

When the outer circumference of the laser light contacts the outer circumference of the acceptance area of the focusing lens 12, the distance between the center of the beam and the optical axis of the focusing lens 12 is $\varnothing_1/2 - \varnothing_2/2 = 0.525$ millimeters. The angle between the direction of the beam and the optical axis of the focusing lens 12 corresponds to the maximum tolerable inclination angle $\theta_{max}$, and therefore the maximum tolerable inclination angle $\theta_{max}$ is calculated as arctan (0.525/15.0)=2.0 degrees.

The above describes embodiments resulting from the inventors applying the present invention, but the present invention is not limited by the drawings and description provided above, which describe only embodiments of the present invention as a portion thereof. For example, in the present embodiment, the resin adhesive 34 containing the inorganic filler 341 described above is used when bonding the collimating lens 3, which converts the laser light LB into parallel beams, to the substrate 4. However, the lens being bonded is not limited to the collimating lens 3, and so the resin adhesive 34 including the inorganic filler 341 described above may also be used when fixing the focusing lens that focuses the laser light LB, for example.

In the present embodiment, an array-type semiconductor laser element is used as the laser light source 2, but the laser light source 2 may instead be a longitudinal single-mode semiconductor laser element single formed by a single DFB laser element or DBR (Distributed Bragg Reflector) laser element that does not include a multiplexer 23 or a semiconductor optical amplifier 25. In this way, other embodiments, operating techniques, or the like that can be achieved by someone skilled in the art based on the above embodiments are all included in the scope of the present invention.

The invention claimed is:

1. A laser module comprising:
   a laser light source that emits a laser light; and
   a lens that is bonded to a surface of a substrate by a resin adhesive, the lens collimating or focusing the laser light emitted from the laser light source, wherein
   the resin adhesive includes a filler whose main component is an inorganic material, and
   a height h of the filler in a direction normal to the surface of the substrate satisfies $$h \leq \frac{d}{2}\sin\theta_{max},$$

where d is width of a bonding surface of the lens in a direction of an optical axis of the laser light and $\theta_{max}$ is tolerable inclination angle of the lens, the inclination angle of the lens being defined as an angle formed between the surface of the substrate and the bonding surface of the lens.

2. The laser module according to claim 1, wherein the height h of the filler is no greater than 8 micrometers when the bonding surface width d of the lens is between 0.5 millimeters and 1 millimeter.

3. The laser module according to claim 1, wherein the filler includes an inorganic material selected from a group of $SiO_2$, $Mg_3Si_4O_{10}(OH)_2$, $Al_2O_3$, AlN, BN, and $TiO_2$ as a main component thereof.

4. The laser module according to claim 1, wherein the filler has a spherical, scale-like, board-like, or pulverized-lump shape.

5. The laser module according to claim 1, wherein content of the filler in the resin adhesive is no less than 25 wt %.

6. The laser module according to claim 1, wherein the resin adhesive includes a resin material selected from a group of epoxy resin, acrylic resin, urethane resin, and silicon resin as a main component thereof.

7. The laser module according to claim 1, wherein the laser light source is a distributed feedback semiconductor laser element.

8. The laser module according to claim 1, wherein the laser light source is a distributed reflector semiconductor laser element.

9. The laser module according to claim 1, wherein
   the laser light source is an array-type semiconductor laser element formed by integrating a plurality of longitudinal single-mode semiconductor laser elements, a semiconductor optical amplifier that amplifies laser light emitted from the longitudinal single-mode semiconductor laser elements, and a multiplexer that guides the laser lights emitted from the longitudinal single-mode semiconductor laser elements to the semiconductor optical amplifier, and
   the lens collimates or focuses the amplified laser light.

10. The laser module according to claim 1, wherein
    the lens collimates the laser light and outputs a collimated laser light,
    the laser module further comprises a focusing lens that receives the collimated laser light, and
    the tolerable inclination angle $\theta_{max}$ is determined based on one or more of a distance between the lens and the focusing lens, a diameter of an acceptance area of the focusing lens in which the laser light is accepted, and a spot size of the laser light.

11. The laser module according to claim 10, wherein when the spot size of the laser light is 0.5 millimeters and the diameter of the acceptance area is 1.55 millimeters, the distance between the lens and the focusing lens is 15 millimeters.

12. The laser module according to claim 2, wherein the height h of the filler is no less than 1.74 micrometers.

13. The laser module according to claim 5, wherein the content of the filler in the resin adhesive is no greater than 95 wt %.

* * * * *